United States Patent
Zhang et al.

(10) Patent No.: US 10,826,467 B1
(45) Date of Patent: Nov. 3, 2020

(54) HIGH-ACCURACY DUAL-MODE FREE RUNNING OSCILLATOR

(71) Applicant: NXP B.V., Eindhoven (NL)

(72) Inventors: Xu Zhang, Chandler, AZ (US); Siamak Delshadpour, Phoenix, AZ (US)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 16/506,451

(22) Filed: Jul. 9, 2019

(51) Int. Cl.
*H03K 3/03* (2006.01)
*H03B 25/00* (2006.01)
*G06F 1/06* (2006.01)

(52) U.S. Cl.
CPC .............. *H03K 3/0315* (2013.01); *G06F 1/06* (2013.01); *H03B 25/00* (2013.01)

(58) Field of Classification Search
CPC ....... H03K 3/0315; G06F 1/06; H03L 7/0995; H03L 7/07; H03B 25/00
See application file for complete search history.

(56) References Cited

U.S. PATENT DOCUMENTS

| | | | |
|---|---|---|---|
| 7,005,933 B1 | 2/2006 | Shutt | |
| 8,058,934 B2* | 11/2011 | Rangarajan | H01L 23/645 331/46 |
| 9,467,092 B1* | 10/2016 | Dreps | G06F 1/26 |
| 10,620,661 B2* | 4/2020 | Murali | G06F 1/14 |
| 2005/0007205 A1* | 1/2005 | Bridger | H03B 5/368 331/108 C |

OTHER PUBLICATIONS

Z.-Y. Yang, R. Y. Chen, "High-Performance Low-Cost Dual 15 GHz/30 GHz CMOS LC Voltage-Controlled Oscillator", IEEE Microwave and Wireless Components Letters, vol. 26, No. 9, pp. 714-716, (Sep. 2016).
Z.-Z. Chen, T.-C., Lee, "The Study of a Dual-Mode Ring Oscillator", IEEE Transactions on Circuits and Systems II: Express Briefs, vol. 58, No. 4, pp. 210-214, (Apr. 2011).

* cited by examiner

*Primary Examiner* — Ryan Johnson (57) ABSTRACT

A free running oscillator (FRO) includes a reference current generator, a current converter, and first and second oscillator cores. The reference current generator generates a first current. The current converter generates a second current based on the first current. The first oscillator core generates a clock signal at a first frequency based on a first value of the second current. The second oscillator core generates a clock signal at a second frequency based on a second value of the second current. The second frequency may be lower than the first frequency, and the second value of the second current lower than the first value of the second current.

15 Claims, 4 Drawing Sheets

HIGH-ACCURACY DUAL-MODE FREE RUNNING OSCILLATOR

TECHNICAL FIELD

Example embodiments disclosed herein relate generally to generating timing signals.

BACKGROUND

Clock signals are used to control a variety of circuits. However, clock signals are not always generated in an efficient manner. For example, many circuits generate clock signals at unnecessarily high frequencies during certain operational modes. In an attempt to improve power management, the system clock may be switched to a low-frequency mode when system activities are in a reduced state, e.g., during a low-power mode or sleep mode. However, implementing this approach requires the use of additional trimming or biasing circuits, especially for higher accuracy applications implemented in a low frequency mode. The use of trimming and biasing circuits increases the cost and complexity of the chip. These circuits also consume substantial amounts of chip space and memory bits.

SUMMARY

A brief summary of various example embodiments is presented below. Some simplifications and omissions may be made in the following summary, which is intended to highlight and introduce some aspects of the various example embodiments, but not to limit the scope of the invention. Detailed descriptions of example embodiments adequate to allow those of ordinary skill in the art to make and use the inventive concepts will follow in later sections.

In accordance with one or more embodiments, an oscillator includes a reference current generator configured to generate a first current, a converter configured to generate a second current based on the first current, a first oscillator core configured to generate a clock signal at a first frequency, and a second oscillator core configured to generate a clock signal at a second frequency lower than the first frequency. The first oscillator core generates the clock signal of the first frequency based on a first value of the second current. The second oscillator core generates the clock signal of the second frequency based on a second value of the second current. The second value is lower than the first value.

The reference current generator may include a first current mirror having a scalable mirroring ratio. The first current mirror may include a selector configured to couple a first transistor in the first current mirror to achieve a first mirroring ratio and to couple a second transistor in the first current mirror to achieve a second mirroring ratio, the second transistor having at least one parameter different from the first transistor. Adjusting the scale of the first current mirror may produce a corresponding change in the second current output from the converter.

The first current mirror may output a first value of the first current for a first mirroring ratio and a second value of the first current for a second mirroring ratio, and the converter may generate the first value of the second current based on the first mirroring ratio and the second value of the second current based on the second mirroring ratio. The converter may include a second current mirror configured to receive the first current and a trimming circuit coupled to the second current mirror and configured to trim an output current of the second current mirror based on a first trimming code. The second current mirror may include a first arm and a second arm, the first arm including a first transistor and the second arm including a plurality of second transistors that mirror the current flowing through the first arm, and the trimming circuit may be coupled to the plurality of second transistors to output the second current.

The first oscillation core may include a number of first inverters, the second oscillator core may include a number of second inverters, and a size of one or more transistors in the number of second inverters may be less than a size of one or more transistors in the number of first inverters. The size may correspond to at least one of a transistor width and a transistor length.

The second oscillator core may include gate and drain dummy devices to match self-capacitive loading of the number of second inverters in the second oscillator core to capacitive loadings of the number of first inverters in the first oscillator core. The second oscillator core may scale an output frequency of the second oscillator core from the first oscillator core frequency, by scaling width over length ratios of pull-up and pull-down devices in the number of second inverters of the second oscillator core.

The oscillator may include a first ripple counter (or delay cell) and a second ripple counter (or delay cell) coupled to the first and second oscillator cores, wherein the ripple counters are configured to control output of the first and second oscillator cores based on one or more predetermined delays, the one or more predetermined delays controlling transitioning of the clock signal at the second frequency to the clock signal at the first frequency or of the clock signal at the first frequency to the clock signal at the second frequency at a predetermined rate.

In accordance with one or more embodiments, an oscillator including a first current mirror configured to generate a first current, a second current mirror configured to generate a second current, and a selector configured to select a mirroring ratio of the first current mirror, wherein the first current mirror is configured to generate a first value of the first current when the selector selects a first mirroring ratio and a second value of the first current when the selector selects a second mirroring ratio, and wherein the second current mirror is to generate a first value of the second current based on the first value of the first current and a second value of the second current based on the second value of the first current. The first value of the second current may control generation of a clock signal at a first frequency, and the second value of the second current may control generation of a clock signal at a second frequency.

The selector may couple a first transistor in the first current mirror based on a first value of a control signal and may couple a second transistor in the first current mirror based on a second value of the control signal. The sizes of the first and second transistors may be different.

The second current mirror may include a first transistor, a plurality of second transistors coupled to the first transistor, and a switching circuit coupled to the plurality of second transistors and configured to adjust the second current based on a trimming code. The switching circuit may include a plurality of switches, the trimming code may include a plurality of bit values, and each of the plurality of bit values may control a corresponding one of the switches.

In accordance with one or more embodiments, an oscillator includes a first current mirror configured to generate a first current and a converter configured to convert the first current to a second current, and an oscillator stage configured to generate a clock signal based on the second current, wherein the oscillator stage generates the clock signal at a first frequency based on a first mirroring ratio of the first current mirror and is to generate the clock signal at a second frequency based on a second mirroring ratio of the first current mirror. The first current mirror may be set to the first mirroring ratio based on a first value of a control signal and the second mirroring ratio based on a second value of the control signal. The converter may include a second current mirror to generate the second current based on the first current and a trimming code.

BRIEF DESCRIPTION OF THE DRAWINGS

Additional objects and features of the invention will be more readily apparent from the following detailed description and appended claims when taken in conjunction with the drawings. Although several example embodiments are illustrated and described, like reference numerals identify like parts in each of the figures, in which:

DETAILED DESCRIPTION

It should be understood that the figures are merely schematic and are not drawn to scale. It should also be understood that the same reference numerals are used throughout the figures to indicate the same or similar parts.

The descriptions and drawings illustrate the principles of various example embodiments. It will thus be appreciated that those skilled in the art will be able to devise various arrangements that, although not explicitly described or shown herein, embody the principles of the invention and are included within its scope. Furthermore, all examples recited herein are principally intended expressly to be for pedagogical purposes to aid the reader in understanding the principles of the invention and the concepts contributed by the inventor(s) to furthering the art and are to be construed as being without limitation to such specifically recited examples and conditions. Additionally, the term, "or," as used herein, refers to a non-exclusive or (i.e., and/or), unless otherwise indicated (e.g., "or else" or "or in the alternative"). Also, the various example embodiments described herein are not necessarily mutually exclusive, as some example embodiments can be combined with one or more other example embodiments to form new example embodiments. Descriptors such as "first," "second," "third," etc., are not meant to limit the order of elements discussed, are used to distinguish one element from the next, and are generally interchangeable. Values such as maximum or minimum may be predetermined and set to different values based on the application.

Figure 1:
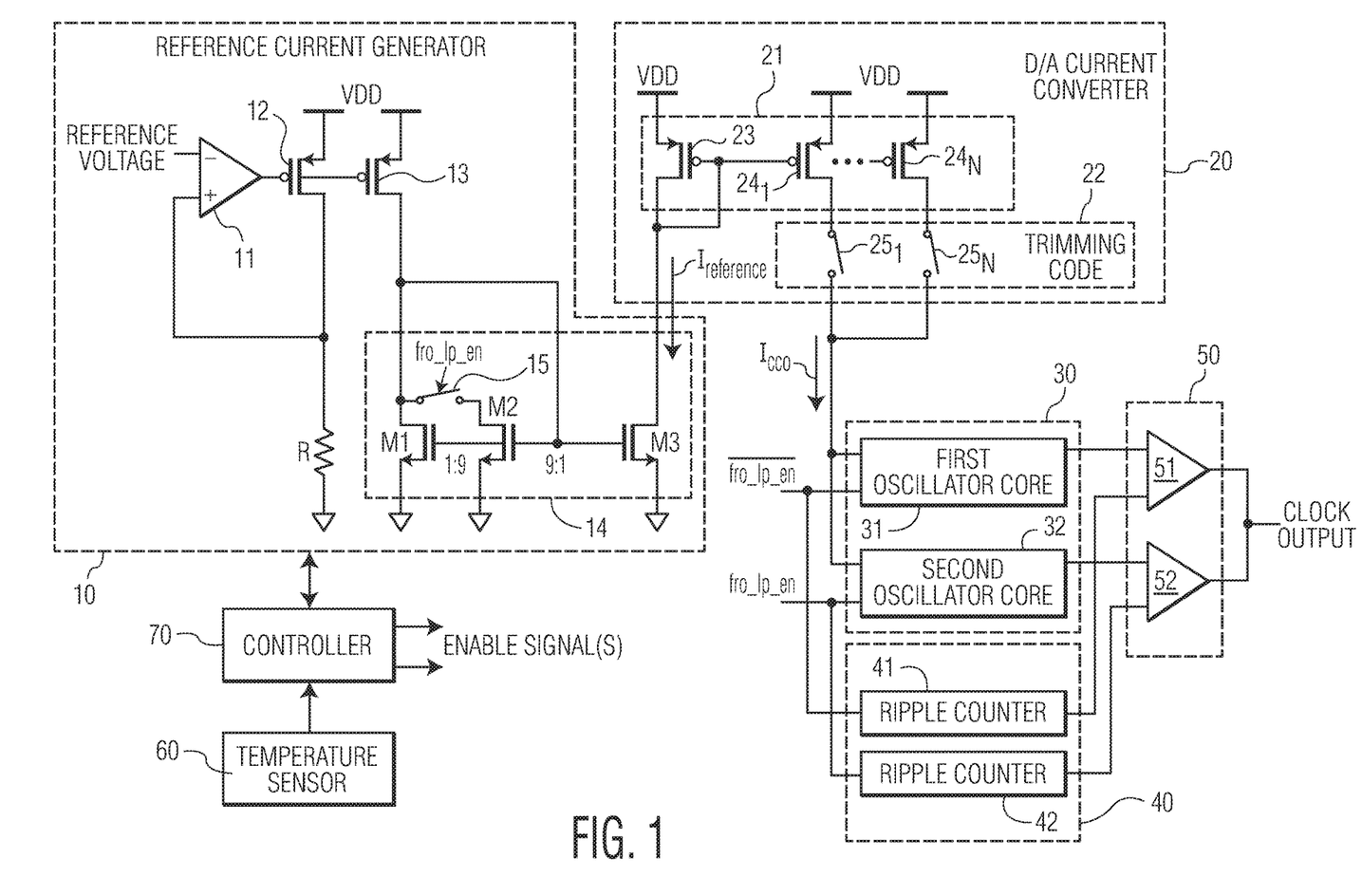
FIG. 1 illustrates an embodiment of a free running oscillator.

FIG. 1 illustrates an embodiment of a free running oscillator (FRO) which operates in multiple modes for generating clock signals. The modes may be determined, for example, by the application or device for which the clock signals are generated. The application or device may be any type of circuit, device, system, or software that is driven by or otherwise operates based on clock or timing signals. Examples include a redriver (e.g., Type-C USB redriver), a USB PD controller, an authentication controller, etc.

The multiple modes may include a first mode and a second mode. The first mode may correspond to a normal/active mode of the device or application and the second mode may correspond to a mode different from the first mode, e.g., the second mode may have different (e.g., lower) frequency requirements than the first mode. In one embodiment, the second mode may correspond to another low-power mode or a normal/active mode of the device or application.

Referring to FIG. 1, the free running oscillator includes a reference current generator 10, a current converter 20, an oscillator stage 30, a ripple counter or delay cell group 40, and an output buffer stage 50. Using these features, the free running oscillator generates clock signals at different frequencies in the first and second modes. (In the embodiment of FIG. 1, the oscillator generates two clock frequencies in different modes (and thus may be described as a dual-mode FRO), but in another embodiment the FRO may generate more than two clock frequencies in different modes.)

The reference current generator 10 includes an amplifier 11, a first transistor 12, a second transistor 13, and a first current mirror 14. The amplifier 11 compares a reference voltage with a feedback signal having a voltage set by a resistor R. The feedback forces the feedback signal to have a voltage which equals the reference voltage. Thus, the current passing through the first transistor 12 corresponds to the reference voltage over R. Ultimately, the current passing through the second transistor is a scaled version of the current passing through the first transistor depending on the sizes differences of the first and second transistors, which typically have the same sizes for a matched current between the two.

The first current mirror 14 generates a scalable reference current for the current converter 20. The reference current may be generated based on a control signal which, for example, determines whether the host application or device is to operate in low-power mode or another (e.g., normal or high) power mode. In one embodiment, the control signal used to scale the first current mirror is a low-power enable signal (fro_lp_enable). This signal controls the state of a selector (e.g., switch) 15 which couples a transistor in the left arm of the first current mirror to a transistor in the right arm of the first current mirror. In one embodiment, the left arm of the first current mirror 14 may include two transistors M1 and M2 and the right arm of the first current mirror 14 may include one transistor M3. The control signal (fro_lp_enable) serves as a select signal for the switch 15. When the control signal has a first value, the switch 15 closes to put M1 and M2 in parallel. As a result, the first current mirror 14 is formed between the total of transistors M1/M2 and transistor M3. When the control signal has a second value, the switch 15 opens to disconnect transistor M2. As a result, the first current mirror 14 is formed by transistors M1 and M3. The first and second values of the switch 15 may be determined, for example, based on whether the switch 15 is formed from an NMOS or PMOS transistor.

The transistors M1 and M2 are of different sizes to scale the reference current generated by the first current mirror. In the example illustrated in FIG. 1, transistor M1 has a smaller size than transistor M2 by a predetermined ratio. As a result, the first current mirror 14 will output different reference currents to the current converter 20 based on the predetermined ratio. For example, in the embodiment of FIG. 1, when transistor M1 is connected in the first current mirror (e.g., switch 15 is open), the size ratio between transistor M1 and transistor M3 is 1:1. Such a ratio may exist when, for example, the first mode is enabled, e.g., when fro_lp_en is logical zero. When this occurs, the reference current $I_{REFERENCE}$ into the current converter 20 has a relatively high value, which, in turn, produces a high current into the oscillator stage 30 (e.g., high-speed oscillator core) based on an applied trimming code. The mirroring ratio may be different in another embodiment.

When transistor M2 is connected in the first current mirror (e.g., switch 15 is closed), the size ratio between the sum of transistor M1 and transistor M2 to transistor M3 is 10:1. Such a ratio may exist when, for example, the second (low-power) mode is enabled, e.g., when fro_lp_en is logical one. When this occurs, the reference current $I_{REFERENCE}$ into the digital-to-analog current converter 20 has a relatively low value, which, in turn, produces a low current into the oscillator stage 30 (e.g., low-speed oscillator core) based on an applied trimming code. The trimming codes used for the high and low power modes may be the same or different.

The current converter 20 includes a second current mirror 21 and a switching circuit 22. The second current mirror 21 includes a left arm and a right arm. The left arm includes one transistor 23 and the right arm includes a plurality of transistors $24_1$ to $24_N$, where N≥2. Transistors 23 and $24_1$ to $24_N$ may be PMOS transistors that are coupled to a voltage supply VDD. The current generated in the left arm is mirrored in the right arm of the second current mirror, but the magnitude of the current output from the right arm is adjusted to generate a bias current $I_{CCO}$ that will help set the output clock signal to a desired frequency.

The transistors $24_1$ to $24_N$ in the right arm are selectively coupled to the multiple core oscillator stage 30 by a corresponding number of switches $25_1$ to $25_N$. The states of the switches are controlled based on a digital trimming code, which determines the size of the current to be input into the oscillation stage 30. The digital trimming code includes a plurality of bits that correspond in number to the number of switches $25_1$ to $25_N$. Each bit of the digital trimming code controls the on/off state of a corresponding one of the switches, a bit having a logical zero may place a corresponding switch in the off state and a bit having a logical one may place a corresponding switch in the on state.

In operation, the current generated in the left arm ($I_{REFERENCE}$) is mirrored in the right arm of the second current mirror 21, but the magnitude of the current is adjusted based on the trimming code. Thus, the current converter 20 converts the digital value of the current indicated by the trimming code to an analog bias current $I_{CCO}$ that is input into the oscillation stage 30. For example, when the second (low-power) mode is enabled by signal fro_lp_en at logic one, transistor M2 is connected in the first current mirror and a relatively low bias current $I_{CCO}$ flows in the left arm of the second current mirror. This low current is mirrored in the right arm of the digital-to-analog converter 20 and then adjusted by the digital trimming code. The magnitude of the bias current $I_{CCO}$ corresponds to a sum of the currents passing through respective ones of the switches $25_1$ to $25_N$ that are selected to be in the on state, as determined by the bits of the trimming code. The resulting output is a bias current $I_{CCO}$ of a desired magnitude that controls the frequency of the clock signal to be output from the oscillation stage 30.

Conversely, when the first mode is enabled by signal fro_lp_en at logic zero, transistor M2 is disconnected in the first current mirror and a relatively high bias current $I_{CCO}$ flows in the left arm of the second current mirror 21. This high current is mirrored in the right arm of the current converter 20 and then adjusted by the trimming code to output a bias current $I_{CCO}$ of a desired magnitude, e.g., the magnitude of current $I_{CCO}$ is based on a sum of the currents passing through respective ones of the switches $25_1$ to $25_N$ that are selected to be in the on state, as determined by the digital bit values of the trimming code. The magnitude of the bias current $I_{CCO}$ determines the frequency of the clock signal output from the oscillation stage 30.

The oscillation stage 30 includes at least two oscillator cores: a first oscillator core 31 and a second oscillator core 32. The first oscillator core 31 generates a clock signal with a frequency in a first predetermined range. The second oscillator core 32 generates a clock signal with a frequency in a second predetermined range. The first predetermined range may be greater than the second predetermined range. In this case, the first oscillator core 31 may be described as generating a high-frequency clock signal and the second oscillator core 32 may be described as generating a low-frequency clock signal. In one embodiment, the low frequency of the clock signal may be a predetermined fraction of the high frequency of the clock signal. In one example, the high frequency may be 48 MHz and the low frequency may be 4.8 MHz, but different frequencies and/or a different predetermined fraction may be used in another embodiment.

The oscillator core used to generate the output clock signal may be selected by a control signal, which, for example, may be the same control signal used to determine the scale of the first current mirror, e.g., the low-power enable signal fro_lp_en. In one embodiment, an inverse of the low-power enable signal may be used to select the first oscillator core 31 and the low-power enable signal may be used to select the second oscillator core 32. The magnitude of the current output from the digital-to-analog current converter 20 determines the frequency (within an applicable one of the first and second frequency ranges) of the output clock signal. In one embodiment, the delay(s) imposed by the ripple counters or delay cells postpones the availability of core output and avoids clock glitch during the startup of the core selected by the mode control signal.

In one embodiment, the ripple counter group 40 may include a first ripple counter 41 and a second ripple counter 42. The first counter 41 controls delay of the clock signal output from the first oscillator core 31, and the second counter 42 controls delay of the clock signal output from the second oscillator core 32. The delay imposed by the first and second counters may be the same or different. The delay(s) imposed by the counters may allow either of the core to output clock signal at a predetermined delay once enabled/selected, for example, in order to prevent clock glitches from occurring during mode transitions.

The output buffer stage 50 includes a first buffer 51 and a second buffer 52. The first buffer 51 outputs the clock signal from the first oscillator core 31 based on the output of the first counter 41. The second buffer 52 outputs the clock signal from the second oscillator core 32 based on the output of the second counter 42. Multiplexers, for example, may be coupled to respective ones of the buffers 51 and 52 to allow the outputs of the first and second counter 41 and 42 to control the timing of the buffer outputs. In the embodiment of FIG. 1, the numbers of oscillator cores, counter filters, and buffers are the same, namely two. In another embodiment, the numbers of oscillator cores, counter filters, and buffers may be a different number, or the numbers of oscillator cores, counter filters, and/or buffers may be different from one another.

Figure 2:
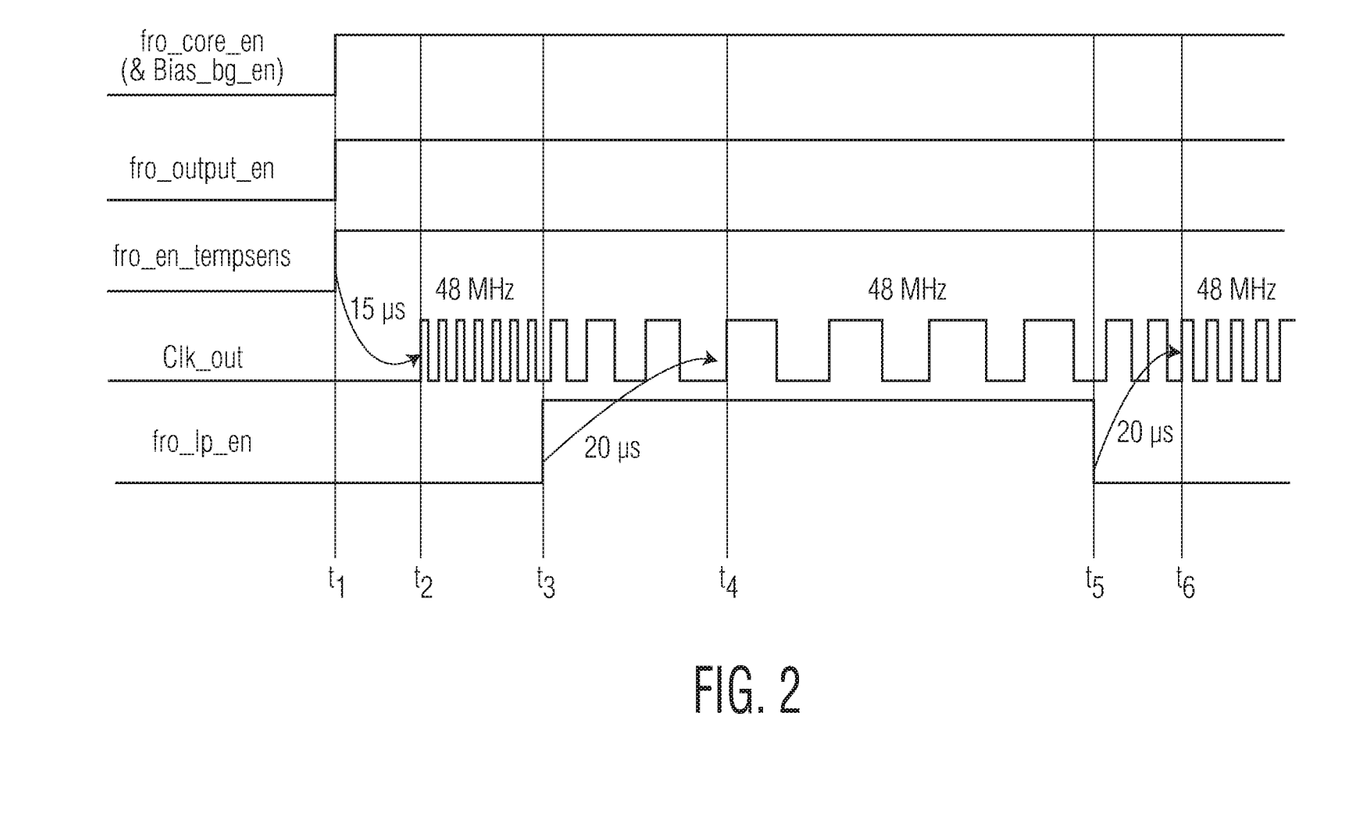
FIG. 2 illustrates an example of a timing diagram for the free running oscillator.

FIG. 2 illustrates an embodiment of a timing diagram that may be used to control the generation of a clock signal, output, for example, by the free running oscillator of FIG. 1. As illustrated in FIG. 2, at time t1, one or more enable signals are generated. The enable signals may include, for example, a signal (fro_core_en) for enabling either first or second oscillator cores 31 and 32, a signal (fro_output_en) for enabling the output buffers 51 and 52, and a signal (fro_en_tempsens) for enabling a temperature sensor 60 for additional temperature compensation for the free-running oscillator.

At time t2, after the enable signal(s) are applied, a clock signal (Clk_out) begins to be output from one of the oscillator cores 31 and 32. A delay time ($\Delta t$) may exist between the time the enable signal(s) are applied and the time when the initial clock signal is generated, e.g., $\Delta t = t2-t1$. The oscillator core that generates the initial clock signal (e.g., prior to low-power mode) may be, for example, a predetermined start-up frequency. In one embodiment, the initial clock signal may be output from the first oscillator core 31 at the higher frequency (e.g., 48 MHz) after $\Delta t = 15$ μs.

At time t3, the low-power enable signal (fro_lp_en) is generated for input into the first current mirror of the reference current generator 10 and the multiple core oscillator stage 30. As a result, transistor M2 is connected in first current mirror. As a result, a low current $I_{REFERENCE}$ is input into the current converter 20. This low current (mirrored in the right arm of converter 20) is adjusted by the digital trimming code to form bias current $I_{CCO}$, which is input into the second oscillator core 32 selected by the low-power enable signal. As a result, the frequency of the clock signal transitions to a low frequency. Ripple counter 42 may force the output of clock signal to be zero during the delay duration (not shown in the figure).

At time t4, the frequency of the output clock signal has decreased and settled to the second frequency (e.g., 4.8 MHz) of the second oscillator core 32. This may take a certain period of time, e.g., 20 s. This frequency may be maintained for a period of time for low power mode operation.

At time t5, the low-power enable signal (fro_lp_en) transitions to a low value, indicating a transition to another operational mode, e.g., a higher power or normal mode. The low value of enable signal fro_lp_en connects transistor M1 in the first current mirror and selects the first oscillator core 31 in stage 30. Connecting transistor M1 in the first current mirror 14 increases the reference current $I_{REFERENCE}$ input into the second current mirror 21. At this time, a new trimming code may be received which adjusts the biasing current that is output from the D/A current converter 20. As a result, the frequency of the output clock signal begins to increase. Ripple counter 41 may force the output of clock signal to be zero during the delay duration (not shown in the figure).

At time t6, the frequency of the output clock signal has reached the frequency of the first oscillator core. This may take a certain period of time, e.g., 10 s. The timing diagram of FIG. 2 applies in the case of start-up. However, a similar set of transitions and adjusted clock frequencies may be implemented at other times after start-up, e.g., at any time a mode change occurs. The enable signals, trimming codes, and other control signals may be generated by a controller 70 illustrated, for example, in FIG. 1. The operations of the controller may be determined, for example, based on instructions or control program stored in a memory. The trimming codes, timing information, and other data may be stored the same or a different memory for access by the controller 70.

Figure 3A:
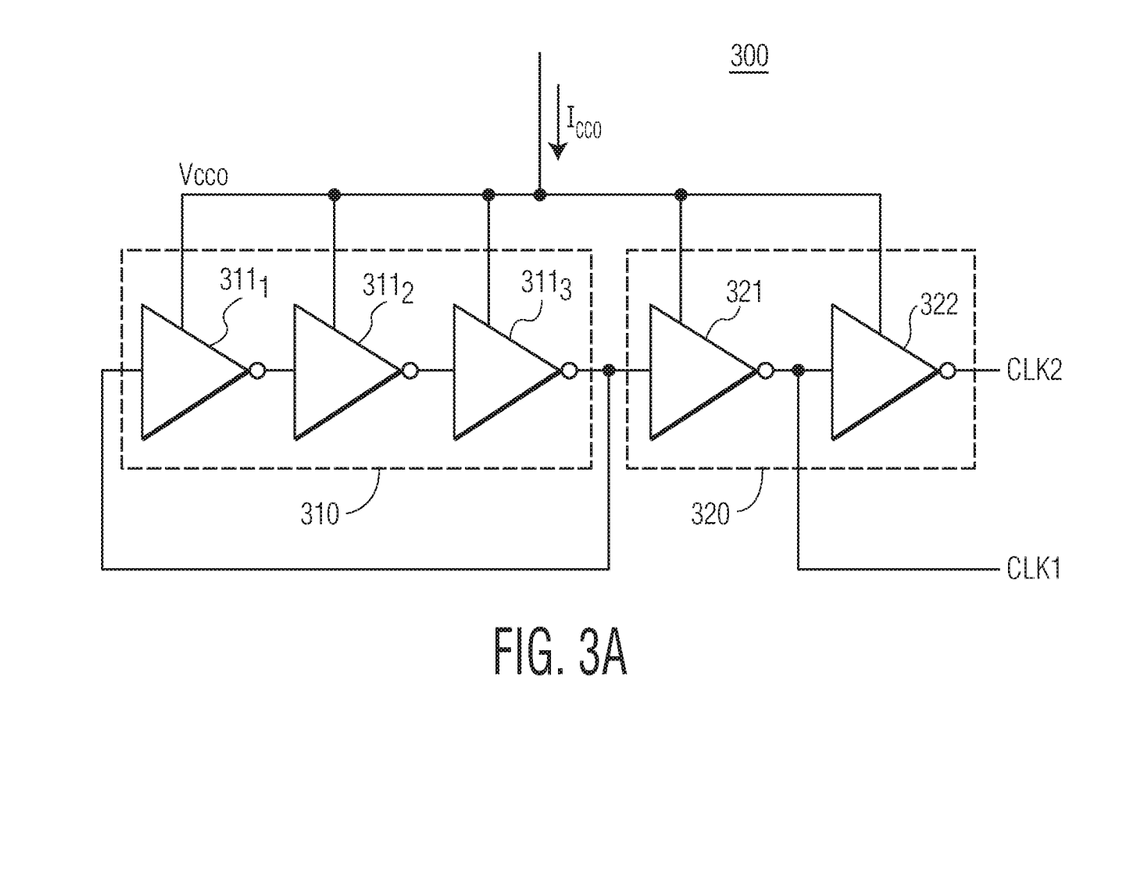
FIG. 3A illustrates an embodiment of an oscillator core for the free running oscillator.

FIG. 3A illustrates an embodiment of an oscillator core 300, which may correspond in structure to the first and second oscillator cores 31 and 32 of the free running oscillator of FIG. 1.

Referring to FIG. 3A, the oscillator core 300 includes a first stage 310 and a second stage 320. The first stage 310 includes an N-stage ring oscillator that is formed from plurality of inverters $311_1$ to $311_N$, where N>3. In one embodiment, N may be an odd number to generate clock pulses at a predetermined frequency determined by the input bias current $I_{cco}$. The second stage 320 includes a first output driver 321 coupled to a second output driver 322, each of which may be implemented by an inverter. The first output driver 321 outputs a first clock signal CLK 1 and the second output driver 322 outputs a second clock signal CLK 2. The first clock signal CLK 1 may be an inverted version of the second clock signal CLK 2. In one embodiment, the output drivers 321 and 322 may be coupled to corresponding level shifters to bring the signal level from $V_{CCO}$ to the FRO supply level.

In operation, the output of the $N^{th}$ inverter of the ring oscillator is fed back to the input of the ring oscillator. Thus, for example, when N=3 and the output of inverter $311_3$ is a logical zero, a first pass through the ring oscillator results in inverter $311_1$ outputting a logical one, inverter $311_2$ outputting a logical zero, and inverter $311_3$ outputting a logical one. The logical one value of inverter $311_3$ is inverted by the first output driver 321 to produce the first clock signal CLK 1 having a logically low (0) value. The output of driver 321 is inverted by the second output driver 322 to produce the second clock signal CLK 2 having a logically high (1) value, which corresponds to the rising edge of a clock signal pulse.

During a second pass through the ring oscillator, inverter $311_1$ outputs a logical zero, inverter $311_2$ outputs a logical one, and inverter $311_3$ outputs a logical zero. The logical zero value of inverter $311_3$ is inverted by the first output driver 321 to produce the first clock signal CLK 1 having a logically high (1) value. The output of driver 321 is inverted by the second output driver 322 to produce the second clock signal CLK 2 having a logically low (0) value, which corresponds to the falling edge of a clock signal pulse.

As this process continues, the series of clock signal pulses corresponding to Clk_out in FIG. 2 is produced. The frequency and duration of the clock pulses are based on a sum of the delays of the inverters in the first and second stages used to generate the clock pulses, with the first and second clock signal CLK 1 and CLK 2 clock signals being shifted (e.g., by 180°) relative to one another.

Figure 3B:
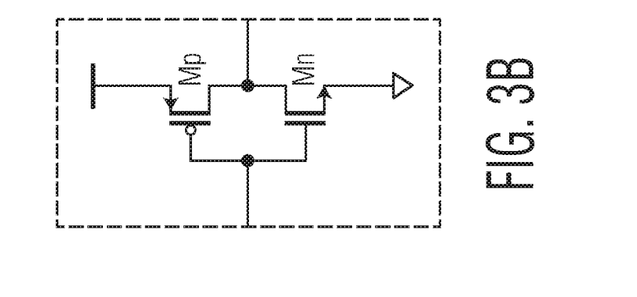
FIG. 3B illustrates an embodiment of an inverter for the oscillator core.

FIG. 3B illustrates an example of the structure of each of the inverters in FIG. 3A, for example, when implemented in the first oscillator core 31 generating the high-frequency clock signal. In this example, each inverter includes a first transistor coupled to a second transistor in series. The first and second transistors may be different types. For example, the first transistor may be a PMOS transistor Mp and the second transistor may be an NMOS transistor Mn. The gates of the first and second transistors are coupled to the output of a previous inverter in the ring oscillator.

When the oscillator core of FIG. 3A is used to implement the first oscillator core 31, the bias current $I_{cco}$ output from the current converter 20 may have a first value. When oscillator core is used to implement the second oscillator core 32, the bias current $I_{CCO}$ output from the current converter 20 may have a second value. The second value is less than the first value. The first and second bias currents cause respective ones of the oscillator cores to generate clock signals with different frequencies. In one embodiment, the different clock signal frequencies output from the oscillator cores 31 and 32 may also be generated based on size differences the devices (e.g., transistors and/or other logic used to implement the inverters, drivers, level shifters, etc.) used to implement the cores.

One way in which the oscillator cores 31 and 32 may generate their respective clock signal frequencies based on bias current bias current $I_{CCO}$ may be explained as follows. As shown in FIG. 3A, the bias current bias current $I_{CCO}$ are supplied to the inverters of each stage 310 and 320. Before an output can be generated, it takes some time (e.g., about one half of an oscillator period) to charge the output of each inverter to $V_{CCO}$ in the ring.

If we ignore the current to the output buffers and assume each inverter in the ring has the same capacitive load C, Equation (1) applies:

$$\frac{Icco}{N} \cdot \frac{1}{2f} = CVcco \quad (1)$$

where f is the oscillator frequency (the clock signal frequency output from oscillator core 31 or the clock signal frequency output from oscillator core 32) and N is the number of stages in the ring, which is 3 for the ring oscillator in FIG. 3. Given Equation (1), the oscillator frequency can be derived as set forth in Equation (2):

$$f = \frac{Icco}{2NCVcco} = \frac{1}{2C\left(\sqrt{\frac{2N}{\beta Icco}} + \frac{N \cdot v_{th}}{Icco}\right)} \quad (2)$$

where $V_{th}$ is the threshold of transistor Mp of the inverters and β is a device parameter (e.g., size, oxide thickness, etc.) for Mp. The device parameter β is proportional to the width-over-length ratio (W/L) of transistor Mp.

High accuracy of the high frequency mode of the FRO (where the clock signal is output from oscillator core 31) may result from the following design considerations. First, the frequency of the high frequency oscillator core 31 is trimmed to reduce, minimize, or remove effects caused by process variations. Second, the free running oscillator in FIG. 1 is designed to exhibit insensitivity to supply variation. Finally, the temperature behaviors of biasing resistors, oscillator cores, reference voltage(s), and/or other components which are susceptible to temperature fluctuations are adjusted to reduce or minimize temperature variation of the free running oscillator, e.g. additional trimming arms could be added in D/A converter to vary the core bias current based on temperature sensor readout in the effort to maintain the oscillator frequency at different temperature.

Figure 4:
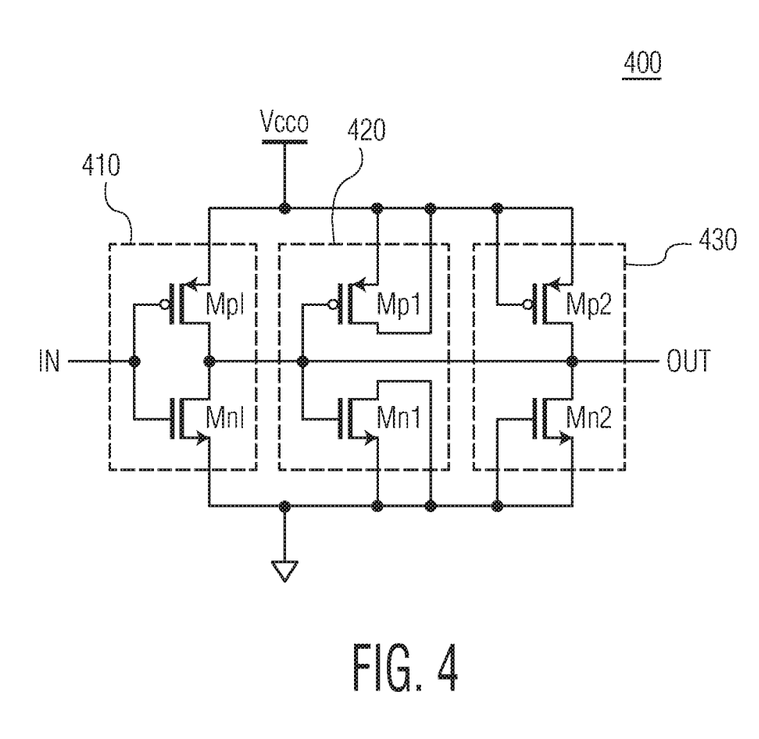
FIG. 4 illustrates an embodiment of an inverter that may be included in an oscillator core.

FIG. 4 illustrates another embodiment of an inverter 400 which may be used to implement one or more of the inverters in the ring oscillator of the second oscillator core 32, e.g., the oscillator core generating the clock signal with the low frequency.

Referring to FIG. 4, the oscillator 400 includes a first stage 410, a second stage 420, and a third state 430. The first stage 410 includes PMOS transistor Mpl and NMOS transistor Mnl which are coupled in series between supply voltage $V_{CCO}$ and a reference potential, e.g., ground. The gates of transistors Mpl and Mnl receive an input signal corresponding to an output of a previous stage in the ring oscillator. In order to scale the clock signal frequency to a lower value, transistors Mpl and Mnl may have widths that are predetermined fractions (e.g., 1/10) of the widths of corresponding transistors Mp and Mn used for the inverters in the first (high-frequency) oscillator core 31.

The second stage 420 includes PMOS transistor Mp1 and NMOS transistor Mn1 coupled in series between supply voltage $V_{CCO}$ and a reference potential, e.g., ground. Each transistor Mp1 and Mn1 has its source and drain coupled together to form a MOSFET capacitor.

The third stage 430 includes PMOS transistor Mp2 and NMOS transistor Mn2 coupled in series between supply voltage $V_{CCO}$ and a reference potential, e.g., ground. Each transistor Mp2 and Mn2 has its gate and drain coupled together to form a diode-connected transistor.

Transistors Mp1, Mp2, Mn1, and Mn2 serve as dummy devices which, together, mimic the gate and drain capacitive effects of transistors Mp and Mn in the first (high-frequency) oscillator core 31. In one embodiment, transistors Mp1 and Mp2 have the same width and length and are close to (e.g., within 10% of) the sizes of transistor Mp in oscillator core 31. Similarly, transistors Mn1 and Mn2 have the same width and length and are close to (e.g., within 10% of) the sizes of transistor Mn in oscillator core 31.

In operation, when the free running oscillator is operating in low-frequency mode, the bias current $I_{CCO}$ output from the digital-to-analog current converter 20 is reduced to a predetermined fraction (e.g., 1/10) of clock frequency of the high-frequency mode, e.g., the clock frequency output from oscillator core 32.

In one embodiment, the bias current $I_{CCO}$ may be scaled down by different ratios for different applications. Scaling may be achieved, for example, by changing the mirroring ratio in the first current mirror in the reference current generator 10, the second current mirror of the current converter 20, or both. Scaling the mirroring ratio may produce a corresponding scaling of the process and temperature behavior of the free running oscillator. From Equation (2), when § is scaled down (e.g., to 1/10) and C is maintained at a constant value by e.g. dummy devices as in FIG. 4, the low-frequency mode of the free running oscillator will have a proportionally reduced frequency, e.g., 1/10 of the clock signal frequency of the high-frequency mode. For example, in the example embodiment of FIG. 1, the first current mirror has a mirroring ratio of 10:1 or 1:1 depending on which one of transistors M1 or M2 is connected. This mirror ratio may be changed (or scaled) to effect a corresponding change in the bias current $I_{CCO}$ input into the oscillator core(s). The output clock frequency may therefore be changed by changing this mirroring ratio.

In one embodiment, the sizes of transistors in one or more of the stages of inverter 400 may be adjusted to predetermined values in order to improve accuracy. For example, in order to size transistors Mp1, Mn1, Mp2 and Mn2. a simulation may be performed where the sizes of transistor these transistors are initially given the same size of Mp and Mn as in FIG. 3B. Then, the sizes (e.g., width, length, or both) of transistors Mp1, Mn1, Mp2 and Mn2 may be gradually reduced until the desired frequency is generated with a minimal sizes changes compared to Mp and Mn which minimizes the differences of voltage and temperature coefficients on capacitance between the dummy devices and the devices in FIG. 3B.

In addition to these adjustments, the process and temperature effects of the free running oscillator may be scaled with the same ratio as the biasing and β scaling. This may generate a clock signal at the low frequency having high accuracy. The process and temperature effects may not scale perfectly, but a limited frequency variation degradation of, for example, 1 to 2% may be acceptable. For example, a 3% accurate FRO, implemented as proposed, at 48 MHz may achieve 5% accuracy at the low clock frequency of 4.8 MHz with one time trimming at the high clock frequency of 48 MHz. In this case, power consumption may be reduced from 107 uA at 48 MHz to 18 uA at 4.8 MHz.

In accordance with one or more embodiments, a free running oscillator generates a high accuracy clock signal in both a high frequency mode and a low frequency mode. The high-frequency mode may be, for example, a normal operational mode of a host device or system. High accuracy in the high frequency mode may be achieved by trimming the biasing current $I_{CCO}$ to the high-frequency oscillator core.

The low-frequency mode may be any of a number of power-saving modes. For example, the low-frequency mode may be a mode that is designed to save power consumption when clock or system activities are reduced or at a minimum. In one embodiment, the low-frequency mode may share the same trimming code and biasing circuit as used in the high-frequency mode. This may exist, for example, for processes where memory bits are expensive (e.g., Qubic4 process). This approach may also save tester time in production, which avoids having to implement extra production test time as is the case with other circuits and methods which have been proposed.

These or other embodiments may be implemented to achieve high frequency accuracy with tolerable degradation. Additionally, the low-frequency mode may require no additional trimming and thus may save the usage of memory bits for the trimming code. The accuracy of the low-frequency mode may also be maintained using a novel approach for scaling down the biasing current and devices in the oscillator core(s). Transition between low- and high-power modes may be controlled to meet various protocol-based system timing requirements.

The controllers, selectors, generators, converters, and other signal-generating and signal-processing features of the embodiments disclosed herein may be implemented in logic which, for example, may include hardware, software, or both. When implemented at least partially in hardware, the controllers, selectors, generators, converters, and other signal-generating and signal-processing features may be, for example, any one of a variety of integrated circuits including but not limited to an application-specific integrated circuit, a field-programmable gate array, a combination of logic gates, a system-on-chip, a microprocessor, or another type of processing or control circuit.

When implemented in at least partially in software, the controllers, selectors, generators, converters, and other signal-generating and signal-processing features may include, for example, a memory or other storage device for storing code or instructions to be executed, for example, by a computer, processor, microprocessor, controller, or other signal processing device. The computer, processor, microprocessor, controller, or other signal processing device may be those described herein or one in addition to the elements described herein. Because the algorithms that form the basis of the methods (or operations of the computer, processor, microprocessor, controller, or other signal processing device) are described in detail, the code or instructions for implementing the operations of the method embodiments may transform the computer, processor, controller, or other signal processing device into a special-purpose processor for performing the methods described herein.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Although the various exemplary embodiments have been described in detail with particular reference to certain exemplary aspects thereof, it should be understood that other example embodiments and modifications are possible. As is apparent to those skilled in the art, variations and modifications can be affected while remaining within the spirit and scope of the invention. Accordingly, the foregoing disclosure, description, and figures are for illustrative purposes only and do not in any way limit the invention, which is defined only by the claims.

We claim:

1. An oscillator, comprising:
   a reference current generator configured to generate a first current;
   a converter configured to generate a second current based on the first current;
   a first oscillator core configured to generate a clock signal at a first frequency; and
   a second oscillator core configured to generate a clock signal at a second frequency lower than the first frequency,
   wherein
      the first oscillator core is configured to generate the clock signal of the first frequency based on a first value of the second current and
      the second oscillator core is configured to generate the clock signal of the second frequency based on a second value of the second current,
      the second value lower than the first value.

2. The oscillator of claim 1,
   wherein the reference current generator includes a first current mirror having a scalable mirroring ratio.

3. The oscillator of claim 2, wherein:
   the first current mirror includes a selector, and
   the selector is configured to couple a first transistor in the first current mirror to achieve a first mirroring ratio and to couple a second transistor in the first current mirror to achieve a second mirroring ratio, the second transistor having at least one parameter different from the first transistor.

4. The oscillator of claim 2, wherein adjusting the scale of the first current mirror produces a corresponding change in the second current output from the converter.

5. The oscillator of claim 4, wherein:
   the first current mirror is configured to output a first value of the first current for a first mirroring ratio and a second value of the first current for a second mirroring ratio, and
   the converter is configured to generate the first value of the second current based on the first mirroring ratio and the second value of the second current based on the second mirroring ratio.

6. The oscillator of claim 2, wherein the converter includes:
   a second current mirror configured to receive the first current, and
   a trimming circuit coupled to the second current mirror and configured to trim an output current of the second current mirror based on a first trimming code.

7. The oscillator of claim 6,
wherein the second current mirror includes a first arm and a second arm, the first arm including a first transistor and the second arm including a plurality of second transistors that mirror the current flowing through the first arm, and wherein the trimming circuit is coupled to the plurality of second transistors to output the second current.

8. The oscillator of claim 1, wherein:
the first oscillator core includes a number of first inverters,
the second oscillator core includes a number of second inverters, and
a width over length ratio of one or more transistors in the number of second inverters is less than a size of one or more transistors in the number of first inverters.

9. The oscillator of claim 8,
wherein the second oscillator core includes gate and drain dummy devices to match self-capacitive loading of the number of second inverters in the second oscillator core to capacitive loadings of the number of first inverters in the first oscillator core.

10. The oscillator of claim 1,
wherein the second oscillator core is configured to scale an output frequency of the second oscillator core from the first oscillator core frequency, by scaling width over length ratios of pull-up and pull-down devices in the number of second inverters of the second oscillator core.

11. The oscillator of claim 1, further comprising:
a ripple counter or delay cell group coupled to the first and second oscillator cores,
wherein the ripple counter is configured to control output of the first and second oscillator cores based on one or more predetermined delays, the one or more predetermined delays controlling the availability of core outputs after a specific core being selected or started during core transition.

12. The oscillator of claim 6, wherein:
the second current mirror includes a plurality of switches,
the first trimming code includes a plurality of bit values, and
each of the plurality of bit values controls a corresponding one of the switches.

13. The oscillator of claim 2, wherein:
the first current mirror includes a selector, a first transistor, and a second transistor, and
the selector is configured to decouple the second transistor in the first current mirror to achieve a first mirroring ratio and to couple the second transistor in the first current mirror to achieve a second mirroring ratio, the second transistor having at least one parameter different from the first transistor.

14. An oscillator, comprising:
a reference current generator configured to generate a first current;
a converter configured to generate a second current based on the first current;
a first oscillator core configured to generate a clock signal at a first frequency;
a second oscillator core configured to generate a clock signal at a second frequency lower than the first frequency;
wherein the first oscillator core is configured to generate the clock signal of the first frequency based on a first value of the second current;
wherein the second oscillator core is configured to generate the clock signal of the second frequency based on a second value of the second current;
wherein the second value lower than the first value; and
wherein the reference current generator includes a first current mirror having a scalable mirroring ratio.

15. An oscillator, comprising:
a reference current generator configured to generate a first current;
a converter configured to generate a second current based on the first current;
a first oscillator core configured to generate a clock signal at a first frequency;
a second oscillator core configured to generate a clock signal at a second frequency lower than the first frequency;
wherein the first oscillator core is configured to generate the clock signal of the first frequency based on a first value of the second current;
wherein the second oscillator core is configured to generate the clock signal of the second frequency based on a second value of the second current;
wherein the second value lower than the first value;
wherein the first oscillator core includes a number of first inverters;
wherein the second oscillator core includes a number of second inverters; and
a width over length ratio of one or more transistors in the number of second inverters is less than a size of one or more transistors in the number of first inverters.

* * * * *